(12) United States Patent  
Kronholz et al.

(10) Patent No.: US 8,445,378 B2
(45) Date of Patent: May 21, 2013

(54) METHOD OF MANUFACTURING A CMOS DEVICE INCLUDING MOLECULAR STORAGE ELEMENTS IN A VIA LEVEL

(75) Inventors: Stephan Kronholz, Dresden (DE); Markus Lenski, Dresden (DE); Ralf Richter, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 225 days.

(21) Appl. No.: 12/839,455

(22) Filed: Jul. 20, 2010

(65) Prior Publication Data

US 2011/0024912 A1 Feb. 3, 2011

(30) Foreign Application Priority Data

Jul. 31, 2009 (DE) .................. 10 2009 035 419

(51) Int. Cl.
*H01L 21/768* (2006.01)

(52) U.S. Cl.
USPC ..... 438/628; 438/637; 438/674; 257/E21.584

(58) Field of Classification Search .......... 438/628–629, 438/637–640
See application file for complete search history.

(56) References Cited

U.S. PATENT DOCUMENTS

| | | | |
|---|---|---|---|
| 2005/0017759 A1 | 1/2005 | Weber et al. | 327/10 |
| 2005/0270822 A1* | 12/2005 | Shrivastava et al. | 365/149 |
| 2006/0151780 A1 | 7/2006 | Ufert | 257/40 |
| 2008/0083921 A1 | 4/2008 | Yasue et al. | 257/40 |
| 2008/0116451 A1* | 5/2008 | Lee et al. | 257/40 |
| 2009/0146202 A1 | 6/2009 | Leong et al. | 257/315 |

FOREIGN PATENT DOCUMENTS

| | | |
|---|---|---|
| DE | 103 55 561 A1 | 6/2005 |
| DE | 102004060738 A1 | 8/2006 |

OTHER PUBLICATIONS

PCT Search Report and Written Opinion from PCT/IB2010/05349 dated Oct. 6, 2010.
PCT International Preliminary Report on Patentability and Written Opinion from PCT/IB2010/05349 Feb. 9, 2012.
Translation of Official Communication from German Patent Office for German Patent Application No. 10 2009 035 419.0-33 dated Jun. 10, 2010.

* cited by examiner

*Primary Examiner* — Thanh Nguyen
(74) *Attorney, Agent, or Firm* — Williams, Morgan & Amerson, P.C.

(57) ABSTRACT

Memory cells in integrated circuit devices may be formed on the basis of functional molecules which may be positioned within via openings on the basis of appropriate patterning techniques, which may also be used for forming semiconductor-based integrated circuits. Consequently, memory cells may be formed on a "molecular" level without requiring extremely sophisticated patterning regimes, such as electron beam lithography and the like.

23 Claims, 8 Drawing Sheets

METHOD OF MANUFACTURING A CMOS DEVICE INCLUDING MOLECULAR STORAGE ELEMENTS IN A VIA LEVEL

BACKGROUND OF THE INVENTION

1. Field of the Invention

Generally, the present disclosure relates to integrated circuits, and, more particularly, to the manufacture of complex circuits including memory areas, for instance in the form of a cache memory of a CPU, with superior bit density.

2. Description of the Related Art

Presently, complex integrated circuits comprise a large number of semiconductor-based circuit elements on a given chip area according to a specified circuit layout, wherein transistor elements represent one of the dominant semiconductor elements in the integrated circuits. Hence, the characteristics of the individual transistors significantly affect overall performance of the overall integrated circuit. Generally, a plurality of process technologies are currently practiced, wherein, for complex circuitry, such as microprocessors, storage chips, ASICs (application specific ICs) and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by a boundary region connecting highly doped drain and source regions with an inversely or weakly doped channel region disposed between the drain region and the source region. The conductivity of the channel region, i.e., the drive current capability of the conductive channel, is controlled by a gate electrode formed near the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length.

On the other hand, the drive current capability of MOS transistors also depends on the transistor width, i.e., the extension of the transistor in a direction perpendicular to the current flow direction, so that the gate length and thus the channel length, in combination with the transistor width, are dominant geometric parameters which substantially determine the overall transistor characteristics, in combination with "transistor internal" parameters, such as overall charge carrier mobility, threshold voltage, i.e., a voltage at which a conductive channel forms below the gate insulation layer upon applying a control signal to the gate electrode, and the like. Thus, performance of the transistors is determined, among other things, by the "size," i.e., the area occupied by the transistor. On the basis of field effect transistors, such as N-channel transistors and P-channel transistors, more complex circuit components are designed, depending on the overall circuit layout. For instance, storage elements in the form of registers and static RAM (random access memory) cells presently represent important components of complex logic circuitries. For example, during the operation of complex CPU cores, a large amount of data has to be temporarily stored and retrieved, wherein the operating speed and the capacity of the storage elements have a significant influence on the overall performance of the CPU. Depending on the memory hierarchy used in a complex integrated circuit, different types of memory elements are used. For instance, registers and static RAM cells are typically used in the CPU core due to their superior access time, while dynamic RAM elements are preferably used as working memory due to the increased bit density compared to registers or static RAM cells. Typically, a dynamic RAM cell comprises a storage capacitor and a single transistor, wherein, however, a complex memory management system is required so as to periodically refresh the charge stored in the storage capacitors, which may otherwise be lost due to unavoidable leakage currents. Although the bit density of dynamic RAM devices may be very high, charge has to be transferred from and to the storage capacitors in combination with periodic refresh pulses, thereby rendering these devices less efficient in terms of speed and power consumption compared to static RAM cells. Thus, static RAM cells may be advantageously used as high speed memory with moderately high power consumption, while, however, requiring a plurality of transistor elements to allow the reliable storage of an information bit.

CMOS technology has made enormous advances in terms of performance of the individual transistor elements by continuously scaling the critical dimensions of the field effect transistors. For example, in sophisticated CMOS devices, several hundred millions of transistors may be implemented, which may have critical dimensions, i.e., a gate length of 40 nm and less. Consequently, the total lateral size of said transistors may be less than 150-100 nm, thereby also allowing moderately high bit densities in corresponding static and dynamic memory areas. Consequently, it has been a great success of the silicon-based CMOS technology to provide an approximately doubled operating speed within a time interval of approximately three years, while the packing density may be even further increased. With any further device scaling, the "top down" scaling principles of the CMOS technology may encounter severe physical limitations, which may have a significant influence on the overall device configuration and the process techniques. For example, a further scaling of transistor elements may be extremely difficult on the basis of well-established materials and process techniques which, in the past, have provided complex and efficient integrated circuit devices, which nevertheless may be produced at an acceptable price. In particular, it may be difficult to further increase the bit density of memory areas since at least one transistor may be required on the basis of advanced memory architectures. For example, by downsizing the individual storage transistors in combination with reducing the overall size of the storage capacitors, the packing density may be reduced, wherein, however, upon encountering severe limitations with respect to the transistor size, a further downscaling is difficult to achieve. Moreover, by reducing the size and thus capacity of the storage capacitors, the refreshing of the leakage currents in the storage capacitors has to be performed more frequently, thereby contributing to a higher complexity of the peripheral control circuitry and also contributing to an increased power consumption. Although static memory cells do not require a storage capacitor, typically, a plurality of transistors are required, which may thus necessitate an even more increased area of the substrate chip. Furthermore a fundamental problem of static and dynamic memory architectures is the volatility of the storage contents since the information is lost upon switching off the supply voltage.

Consequently, alternative approaches are currently investigated in order to provide a higher information density while circumventing one or more of the problems encountered by the limitations of CMOS technology. In some sophisticated concepts, the storage of one or more bits of information is based on different distinguishable states of an appropriate material, wherein these different states may be set in a controllable manner and may also be "read out." For example, a different electrical resistance, i.e., at least two different resistance values, may provide an efficient storage element since the at least two different resistance states may be reliably sensed on the basis of appropriate control circuitry. In other cases, any other appropriate different states of a material, such as magnetic characteristics on a molecular level, polarity of a material, different optical characteristics and the like, may be efficiently used for representing different states and thus one or more bits of information. In other concepts, the electrical resistance may be changed on the basis of a phase change material which may be thermally switched between a crystalline and an amorphous state. Consequently, a plurality of mechanisms may be available, many of which may provide a non-volatile memory architecture, wherein the actual storage of information may not depend on semiconductor-based transistor elements. Thus, a plurality of substances have been developed which are mainly based on specifically designed molecules, which may also be referred to as functional molecules, which may be applied on the basis of any appropriate solution in order to form a layer or film on an appropriate carrier material. A functional molecule may typically be comprised of one or more polymer chains, in which functional groups may be added or may substitute respective atoms or molecules of the basic monomer. However, although such functional molecules may be readily designed in accordance with specific requirements for, for instance, providing a "molecular switch" and the like for implementing the basic function of a memory element, the provision of an individual memory cell and its addressability are difficult to achieve, in particular when a size of the resulting memory cell is to be obtained that is less than the size of sophisticated semiconductor-based transistor elements. For example, great efforts are being made to provide electronic devices on the basis of molecular electronics, in which functional elements in combination with peripheral components, such as connections, conductive lines and the like, are to be provided on a molecular level. In other very promising approaches, the integration of "molecular electronics" into well-established CMOS technologies is under investigation in order to combine advantages of CMOS technology, such as reliability and low cost, with increased packing density of critical device areas, such as memories and the like. For this purpose however, the specifically designed functional molecules, and thus the corresponding molecular films, have to be patterned in a reliable manner in order to obtain functional elements, such as memory cells with a required degree of uniformity. On the other hand, the patterning of the molecular films should not be dependent on specific lithography techniques and their resolution capabilities in order to enable efficient usage of functional molecules irrespective of the currently available lithography capabilities.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to integrated circuit devices and manufacturing techniques in which functional molecules, acting as a storage element, may be efficiently applied on the basis of CMOS compatible techniques, thereby enabling the production of efficient integrated circuit devices comprising CMOS components and circuit elements formed on the basis of functional molecules. For this purpose, in some illustrative aspects disclosed herein, the functional molecules may be efficiently adapted in size to the patterning capability of CMOS techniques by using respective openings or vias in a certain device level to accommodate a predefined number of functional molecules. In some aspects, the vias may be formed according to manufacturing strategies as may typically be applied when forming contact levels or metallization systems of sophisticated semiconductor devices so that the corresponding available "capabilities" of patterning and lithography techniques may be efficiently used, while the actual floor space required for a circuit element, such as a memory cell, may be restricted to the via due to the efficient confinement of the functional molecules. Furthermore, appropriate "electrodes" for operatively connecting to the functional molecules may be provided in the form of metal lines and the like, which may also be formed on the basis of manufacturing techniques used during the formation of metallization systems of CMOS devices. Furthermore, since the concept of confining functional molecules to corresponding vias may be applied for a plurality of device levels, a significant overall bit density may be accomplished, for instance in a specified portion of a metallization system, thereby providing significant advantages, independent of the actual lateral dimensions of the corresponding vias.

One illustrative method disclosed herein comprises forming a dielectric material layer above a first conductive region of an integrated circuit device. The method further comprises forming an opening in the dielectric material layer, wherein the opening has specified lateral dimensions and a specified depth and extends towards the first conductive region. The method further comprises positioning one or more functional molecules in the opening, wherein each of the one or more functional molecules has at least two different states for representing at least one bit of information. Furthermore, a size of the one or more functional molecules is adapted to the specified lateral dimensions and/or to the specified depth, wherein the functional molecules are also operatively connected to the first conductive region so as to enable access to the one or more functional molecules in the opening. Additionally, the method comprises forming a second conductive region so as to operatively connect to the one or more functional molecules.

A further illustrative method disclosed herein relates to forming a semiconductor device that comprises a memory area. The method comprises forming a via in an interlayer dielectric material that is formed above a first device layer, which in turn comprises a first electrode region. The method further comprises filling in the via with one or more functional molecules which have at least two different functional states for representing at least one bit of information, wherein the one or more functional molecules are operatively connected to the first electrode region. Additionally, a second device layer is formed above the first device layer and a second electrode region is formed in the second device layer, wherein the second electrode region is operatively connected to the one or more functional molecules.

One illustrative integrated circuit device disclosed herein comprises a plurality of semiconductor circuit elements formed in and above a semiconductor layer that is formed above a substrate. The integrated circuit device further comprises a metallization system formed above the substrate. A memory area is formed in the metallization system and comprises two or more via levels, wherein each via contains one or more functional molecules that are configured to store at least one bit of information.

BRIEF DESCRIPTION OF THE DRAWINGS

The disclosure may be understood by reference to the following description taken in conjunction with the accompanying drawings, in which like reference numerals identify like elements, and in which.

Figure 1A:
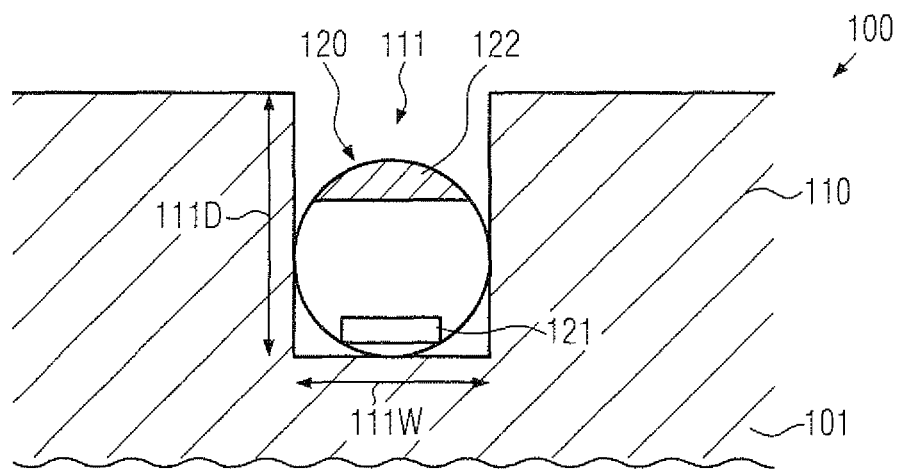
FIGS. 1a-1c schematically illustrate cross-sectional views of an opening formed in a dielectric material and containing functional molecules, the size of which may be adapted to the size of the opening, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to the principles disclosed herein, memory cells may be formed on the basis of "molecular electronics" by appropriately positioning one or more functional molecules in an opening formed in a dielectric material, which may be patterned on the basis of available patterning techniques as may be used in CMOS strategies. In this context, a functional molecule is to be understood as any molecule having a size in at least one direction of approximately 0.5-100 nm and which may have at least two well-defined states that may be detected on the basis of electronic signals. For instance, it is well known that polymer chains may be provided with a desired length, wherein additional molecules or atoms may be incorporated in order to impart specific characteristics to the basic polymer molecule. For example, the electronic configuration of the functional molecule may be reconfigured on the basis of electrical signals, at least in two different ways, thereby providing different electrical characteristics, which may thus be used for storing a bit of information. In other cases, energy deposition may result in a specific spatial reconfiguration, such as a highly ordered state and a highly disordered state, thereby also altering the characteristics and thus the response of the functional molecule with respect to electric fields, magnetic fields and the like. Frequently, such functional molecules may be designed so as to have one or more functional groups for bonding to specific atomic species, such as gold, copper, platinum and the like, while substantially not forming a stable bond to other materials, such as dielectric materials in the form of silicon dioxide and the like. In some cases, different "anchor" portions may be provided, which may form stable bonds with different types of materials, thereby also enabling the desired orientation of the functional molecules with respect to a specified anchoring or adhesion material, while the remaining anchor portion of the functional molecules may be contacted by a different type of material. Thus, the present disclosure should be not be considered as being restricted to any type of functional molecule, as long as at least two different distinguishable states of these molecules may be controllably set and detected on the basis of electromagnetic interaction. Since the functional molecules may be designed with a high degree of freedom in view of size, an appropriate adaptation to currently available patterning techniques used in CMOS technology may be accomplished. On the other hand, if a certain type of functional molecule has given characteristics with respect to size, an appropriate opening in a dielectric material may be readily adapted to the size of the molecule on the basis of the principles disclosed herein, without requiring sophisticated patterning techniques, such as electron beam lithography and the like. Consequently, by appropriately adapting the size of functional molecules and/or the size of micelles used for providing appropriately sized anchor areas within the via openings, with respect to the size of the via opening, memory elements on the basis of molecular species may be efficiently incorporated into manufacturing strategies used for CMOS devices, thereby providing the potential for significantly increasing the overall information density. For example, memory cells with a lateral size of 50 nm and significantly less, for instance of 10 nm and less, may be implemented into semiconductor-based integrated circuit devices, wherein, in some illustrative embodiments, the concept may be applied to various device levels, thereby obtaining a stacked or three-dimensional memory area.

FIG. 1a schematically illustrates a portion of an integrated circuit device 100 that may comprise a substrate 101, such as a semiconductor carrier material, or any other appropriate carrier material for forming thereabove semiconductive materials and/or dielectric materials and/or conductive materials, as required. For example, in the embodiment shown, a dielectric material 110 is formed above the substrate 101 and may comprise an opening 111, which may also be referred to as a "via" since typically in the opening 111, any material to be filled in the opening 111 to connect to a conductive region (not shown) positioned below the dielectric material 110 and above the substrate 101. The opening 111 may have lateral dimensions 111W that are compatible with the patterning capabilities of CMOS technologies, and may thus be in the range of several nanometers to several hundred nanometers. Similarly, a depth 111D of the opening 111 may be in the range of several nanometers to several hundred nanometers, depending on the size of a functional molecule 120 which is to be used as a functional element for providing a memory cell within the opening 111. As previously explained, the functional molecule 120 may represent any appropriate molecule, typically an organic material in combination with additional substituents for functional groups, in order to obtain at least two different states that may be set and detected on the basis of electromagnetic signals. In FIG. 1a, the functional molecule 120 may have a substantially spherical shape with dimensions such that a single molecule 120 may be accommodated by the opening 111. In other cases, two or more functional molecules 120 may be used so as to act as a storage element within the opening 111, as will be discussed later on in more detail. The functional molecule 120 may comprise one or more specific functional groups 121, 122, for instance in order to provide adherence to a specific material, such as a material provided at the bottom of the opening 111, thereby ensuring a reliable adhesion of the molecule 120 within the opening 111. Similarly, the functional group 122 may provide superior adhesion to a further material still to be formed above the dielectric layer 110 in a later manufacturing stage. For example, it is well known that sulfur may form stable chemical bonds with gold, thereby enabling a reliable adhesion of functional molecules including a sulfur species to a gold material. In other cases, the functional groups 121 and/or 122 may form bonds with other materials, such as copper, platinum, titanium and the like. Adhesion of the functional groups 121, 122 to other materials, such as polymer materials, inorganic dielectric materials, low-k dielectric materials and the like, may be significantly reduced, thereby enabling an efficient "patterning" of a corresponding molecular film containing the functional molecules 120, for instance by removing non-bonded functional molecules from the layer 110, for instance on the basis of a rinsing in de-ionized water and the like. Consequently, by appropriately selecting the dimensions 111D and 111W of the opening 111 on the basis of available patterning techniques, and in consideration of the functional molecule 120, functional elements, such as memory cells, may be provided in accordance with any desired layout corresponding to the position of the corresponding openings 111.

Figure 1B:
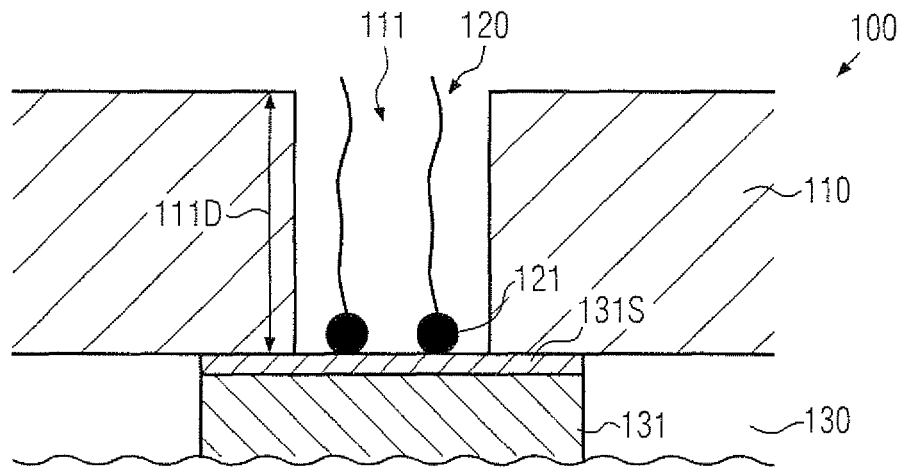

FIG. 1b schematically illustrates the device 100 in which two or more functional molecules 120 having a substantially elongated shape are positioned in the opening 111 and may adhere to a conductive region 131 that may be formed within a dielectric material 130. For example, the conductive region 131 may represent a metal line, a semiconductive material and the like, wherein the surface characteristics thereof are appropriately selected such that adhesion of the molecules 120 is ensured. For example, the conductive region 131 may comprise a surface layer 131S, for instance comprised of copper, gold, platinum and the like, which may allow the functional groups 121 to bond to the layer 131S. Furthermore, the size of the opening 111 and the size of the functional molecules 120 are adapted to each other to incorporate a specific number of molecules in order to obtain uniform performance characteristics for a plurality of openings filled with the functional molecules 120. Furthermore, the depth 111D of the opening 111 is selected such that the functional molecules 120 may be operatively contacted by a further signal line to be formed above the dielectric material 110. In this respect, it should be understood that "operatively connecting or contacting" the functional molecules 120 is to enclose a "direct" bonding of the molecules 120 to the material of the signal line, thereby enabling a direct exchange of charge carriers between the molecules 120 and the signal line. In other cases, an additional material may be provided between a corresponding signal line and the molecules 120, thereby allowing exchange of charge carriers by tunneling currents and the like. In still other cases, the molecules 120 may be "operatively" contacted via an electric field with an intermediate material, for instance by changing the effective dielectric constant and the like. Depending on the type of "contact" of the functional molecules 120 with one or more of the electrode signal lines, the depth 111D in correlation with a length of the functional molecules 120 may be appropriately selected.

Figure 1C:
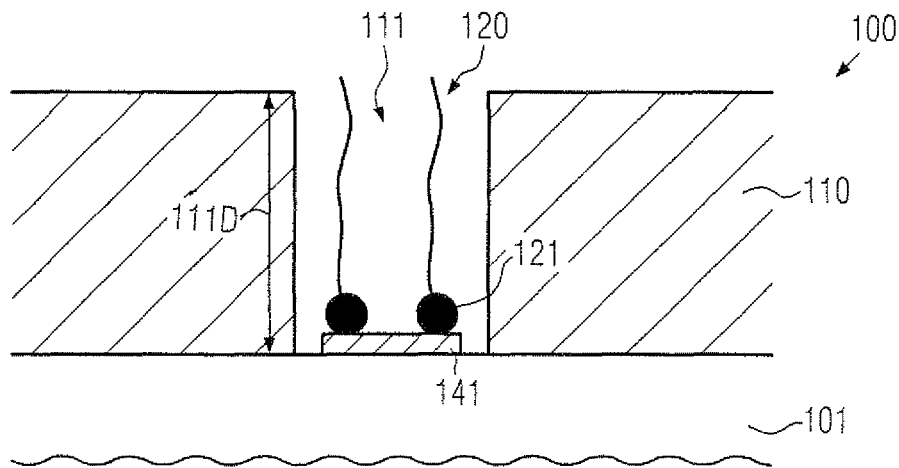

FIG. 1c schematically illustrates the device 100 according to further illustrative embodiments in which the opening 111 comprises an adhesion cluster 141, for instance comprised of an appropriate metal and the like, wherein the size of the cluster 141, i.e., an exposed surface area thereof, which is available for interacting with the molecules 120, for instance with the functional groups 121, may determine the number of molecules that may actually be provided within the opening 111. In this case, the lateral dimension of the opening 111 may be selected substantially independently from the lateral size of the molecules 120, since the number thereof may be efficiently adjusted on the basis of the size of the adhesion cluster 141. In this case, only the depth 111D may be selected so as to correspond to the length of the molecules 120 in an appropriate way. Consequently, an increased degree of freedom may be accomplished by providing the adhesion cluster 141 for given patterning capabilities of the technology used for forming the opening 111.

Figure 1D:
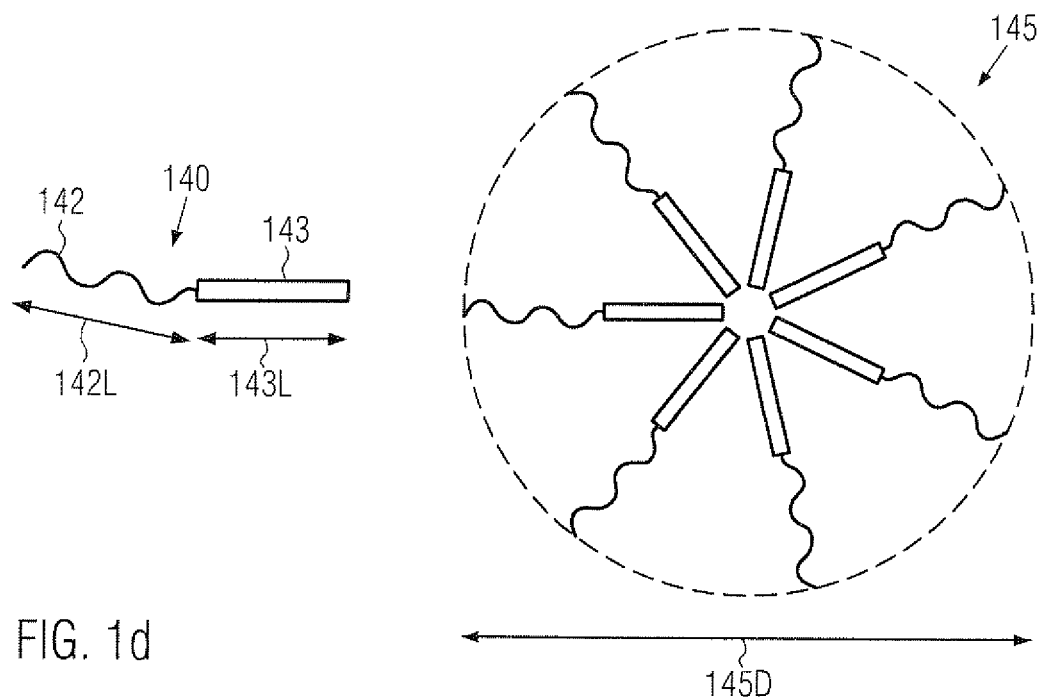
FIGS. 1d-1e schematically illustrate di-block copolymer molecules and corresponding micelles formed on the basis of the copolymer molecules.
Figure 1E:
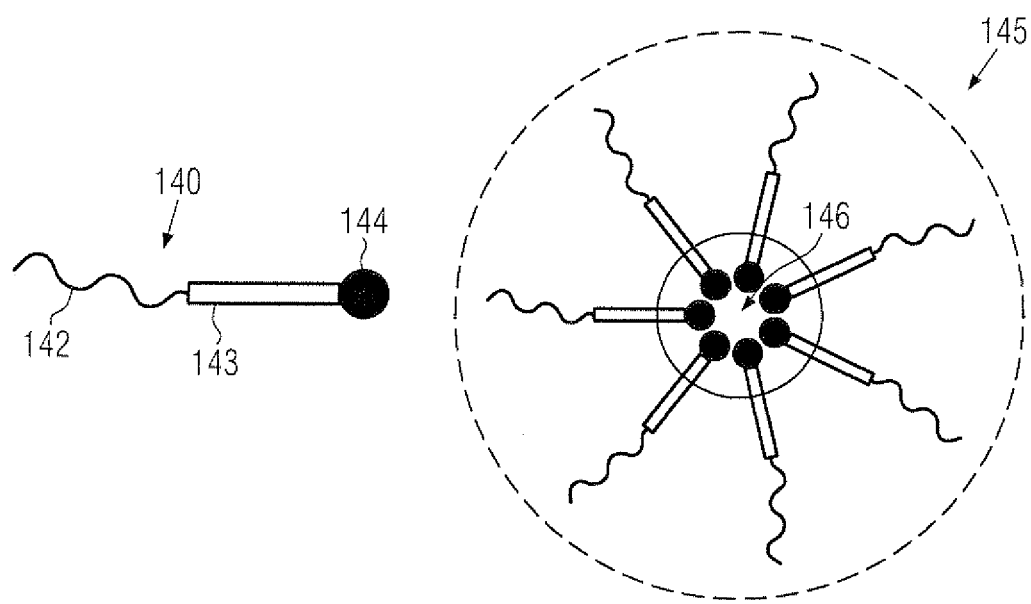

With reference to FIGS. 1d-1f, various possibilities will be explained to provide a well-defined size of the adhesion cluster 141 (FIG. 1c) within the opening 111.

FIG. 1d schematically illustrates at the left-hand side a copolymer 140, i.e., a molecule consisting of a first polymer chain 142 and a second polymer chain 143. Thus, the polymer chain 142 may be comprised of a plurality of substantially identical basic building blocks, similar to the polymer chain 143, wherein, however, a different basic monomer may be used. The polymer chains 142, 143 may have corresponding lengths 142L, 143L, which may be appropriately selected, as will be described later on in more detail. For example, the individual polymer chains 142, 143 may represent a hydrophilic and a hydrophobic portion, respectively, which may thus result in a specific type of "clustering" when the molecules 140 are dispersed in an apolar dilution. For example, the right-hand side of FIG. 1d schematically illustrates a corresponding agglomeration of molecules 140 within a solution, wherein the agglomeration may also be referred to as micelle 145. Thus, the size of the micelle 145 may be efficiently adjusted by adjusting the individual length of the polymer chains 142 and 143.

FIG. 1e schematically illustrates a copolymer 140 with a metallic species 144, which may be bonded to, for instance, the polymer chain 143 on the basis of any appropriate molecule containing the metal species 144. For example, it is well known that di-block copolymers may be efficiently "doped" on the basis of $AuHCl_4$, wherein the corresponding micelle 145 may thus form a metal cluster, for instance in the form of a monocrystal gold cluster, as indicated by 146. Consequently, the size of the cluster 146 may also be adjusted on the basis of the polymer chains 142 and 143, thereby also adjusting the overall size of the micelle 145, as previously explained. Consequently, based on the micelle 145 including the cluster 146, a well-defined amount of a metal species may be positioned within the opening 111 in order to form the adhesion cluster 141 (see FIG. 1c).

It should be appreciated that the functional molecules 120 and the copolymers 140 may be formed in accordance with well-established techniques, wherein the size of these molecules may be efficiently measured on the basis of well-established measurement techniques.

Figure 2A:
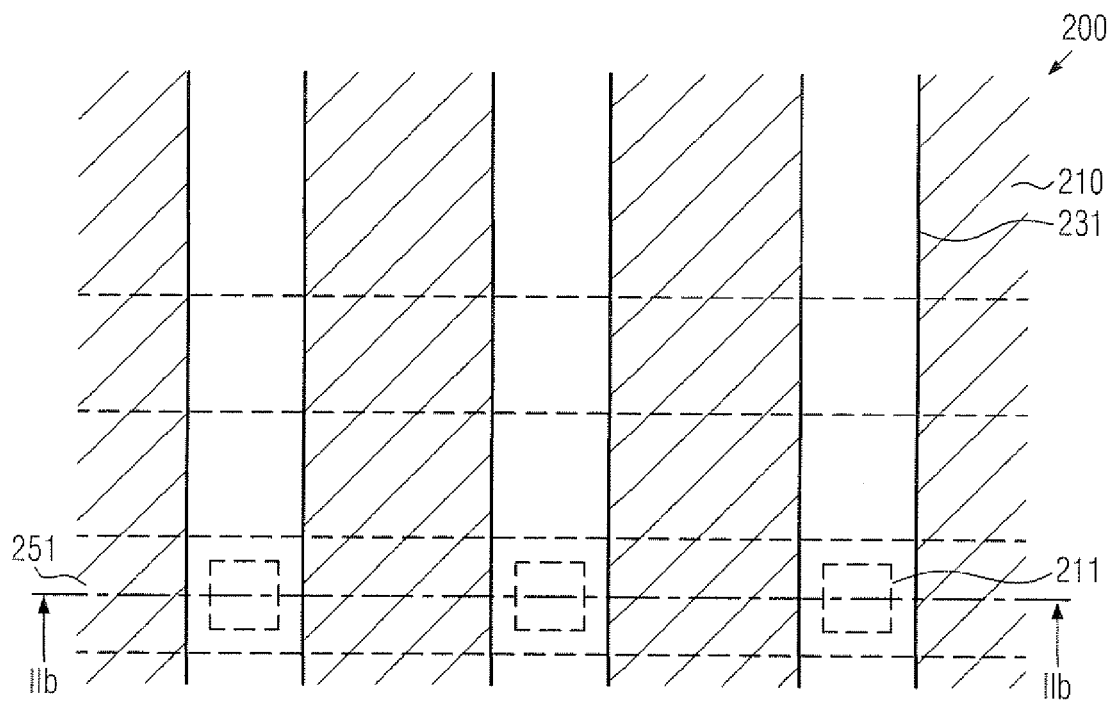
FIG. 2a schematically illustrates a top view of an integrated circuit device and a basic array of memory cells by using functional molecules, according to illustrative embodiments.

FIG. 2a schematically illustrates a top view of an integrated circuit device 200, in which a plurality of vias or openings 211 may be formed in a dielectric material 210, wherein each of the openings 211 may operatively connect to corresponding conductive lines 231 formed in any appropriate material positioned below the dielectric material 210, as will be explained later on in more detail. The plurality of openings 211 in combination with the conductive lines 231 and further conductive lines 251 to be formed above the dielectric material 210 may represent a memory area, wherein a storage element may be provided within each of the openings 211 on the basis of functional molecules, such as the molecules 120 as previously explained with reference to FIGS. 1a-1c. It should be appreciated that the layout of the device 200 may be selected such that the components 231, 211 and 251 may be formed on the basis of available patterning techniques, as may be used in CMOS technologies, wherein any additional adaptation required for providing memory cells within the openings 211 may be accomplished without requiring more sophisticated lithography or patterning techniques.

Figure 2B:
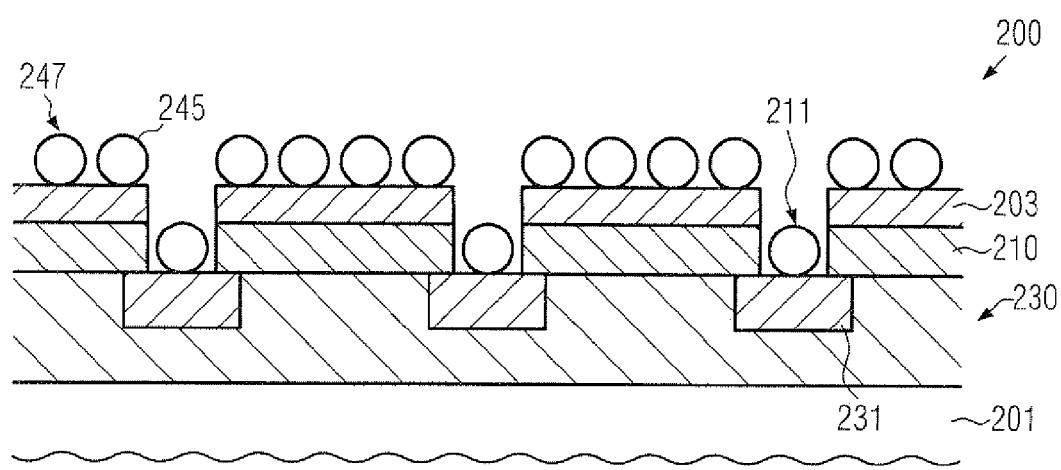
FIGS. 2b-2d schematically illustrate cross-sectional views of the device during various manufacturing stages in selectively providing an adhesion material on the basis of micelles of a specified size, according to illustrative embodiments.

FIG. 2b schematically illustrates a cross-sectional view of the device 200 along the line IIb of FIG. 2a. As illustrated, the device 200 may comprise a substrate 201 above which may be formed a device layer 230, for instance comprised of any appropriate dielectric material in which the conductive regions or lines 231 are laterally embedded. With respect to any characteristics of the substrate 201, the same criteria may apply as previously explained with reference to the device 100. For example, the device level 230 may represent a metallization layer, i.e., the lines 231 may represent metal-containing lines, for instance formed on the basis of copper, aluminum, silver, platinum, gold and the like, in combination with an appropriate dielectric material, such as low-k dielectric materials and the like. In this context, a low-k dielectric material is to be understood as a dielectric material having a dielectric constant of approximately 3.0 and less. The dielectric layer 210 may be formed above the device layer 230 and may also be referred to as an interlayer dielectric material separating the device layer 230 from a subsequent device layer (not shown) that is still to be formed, so as to provide the metal regions 251 (FIG. 2a). Furthermore, in this manufacturing stage, a mask layer 203 may be formed above the dielectric material 210, which may be comprised of any appropriate material, such as photoresist and the like. The mask layer 203 may define the size and position of the openings 211.

The device 200 as illustrated in FIGS. 2a and 2b may be formed on the basis of the following processes. After providing the substrate 201, the device layer 230 may be formed, for instance by depositing a dielectric material, patterning the same and filling in an appropriate conductive material in order to obtain the regions 231. It should be appreciated that other circuit components may be formed in and above the substrate 201, for instance in the form of semiconductor-based circuit elements, as will be described later on in more detail. The patterning of the dielectric material of the layer 230 may be accomplished on the basis of available lithography and etch techniques or other patterning techniques, such as nano imprint techniques and the like. In other cases, the conductive regions 231 may represent doped semiconductor areas, which may be obtained on the basis of implantation processes and corresponding implantation masks.

It should be appreciated that, in the embodiment shown in FIG. 2b, a specific adhesion material for the regions 231 to accept functional molecules may not be required, since appropriate adhesion clusters may be formed on the basis of a molecular film 247, which may include appropriate micelles 245 with specific adhesion clusters, such as the cluster 146 as illustrated in FIG. 1e. In other cases, the material of the conductive regions 231 may per se act as an adhesion material or a dedicated surface layer may be formed.

Thereafter, the dielectric material 210 may be formed, for instance by any appropriate deposition technique, such as chemical vapor deposition (CVD) and the like, in order to provide the material of the layer 210 with the desired dielectric characteristics. For example, silicon dioxide, silicon nitride, silicon carbide and combinations thereof may be efficiently used and represent well-established dielectric materials in the CMOS technology. Furthermore, low-k dielectric materials may be used if considered appropriate in view of the overall performance of the device 200. Next, the mask layer 203 may be applied, for instance by well-established techniques, and may be patterned on the basis of available patterning techniques. It should be appreciated that the thickness of the layer 210 may be appropriately selected so as to be adapted to the size of the micelles 245 and/or to the size of corresponding functional molecules to be positioned within the openings 211 in a later manufacturing stage. As previously discussed, in particular, the size of the micelles 245 may be adjusted with a high degree of flexibility, thereby enabling an efficient adaptation of the layer thickness. Thereafter, the openings 211 may be formed in the layer 210 in accordance with well-established anisotropic etch techniques. Next, the molecular film 247, including the specifically prepared micelles 245, i.e., the agglomerations of copolymer chains with functional groups, may be applied, for instance by spin coating, wherein a well-defined number of micelles 245 may be positioned within the openings 211.

Figure 2C:
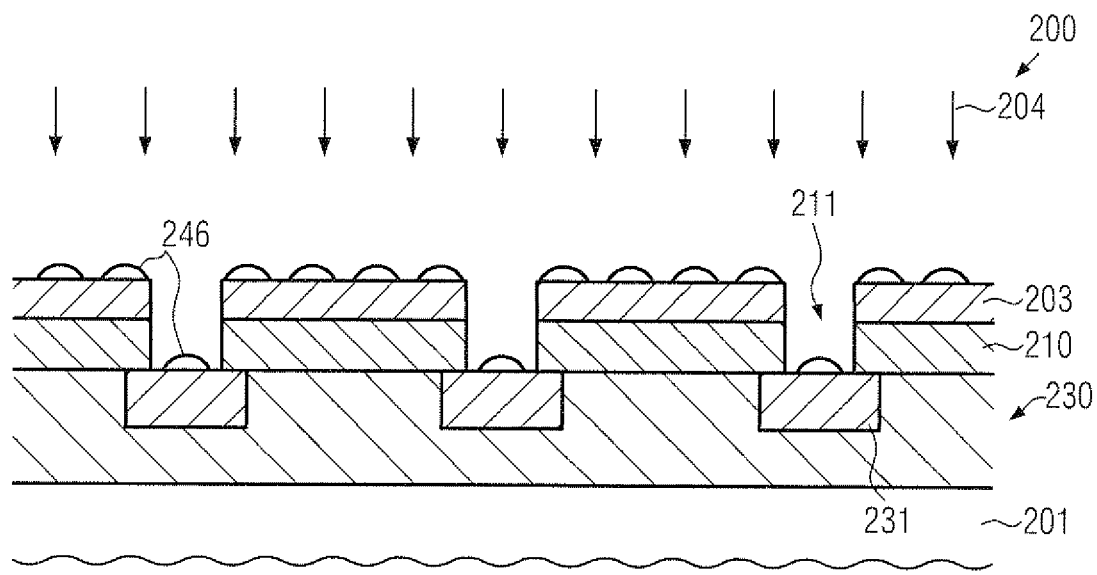

FIG. 2c schematically illustrates the device 200 when exposed to a reactive process ambient 204, for instance in the form of an oxygen plasma, a hydrogen plasma and the like, in order to remove the polymer components selectively with respect to the metal species in the micelles 245 (FIG. 2b). Consequently, during the process 204, corresponding clusters 246 may be formed on the mask layer 203 and within the openings 211 wherein, as previously explained, the adhesion clusters 246 may have a specified size. Consequently, the adhesion clusters 246 within the openings 211 represent well-defined areas for accepting functional molecules in a later manufacturing stage.

Figure 2D:
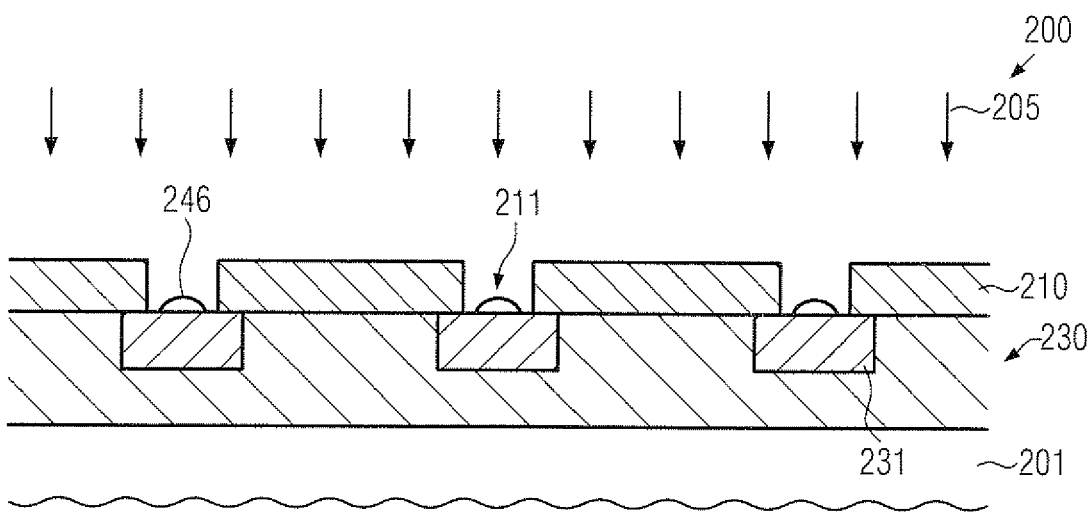

FIG. 2d schematically illustrates the device 200 when exposed to a process ambient 205 that is appropriately configured in order to remove or lift off the mask layer 203 of FIG. 2c. For example, the process ambient 205 may be established on the basis of an appropriate solution, such as acetone, which may remove the material 203 selectively to the material 210 and the adhesion clusters 246, thereby also removing the clusters 246 formed on the mask layer 203 as shown in FIG. 2c. Thus, the clusters 246 are selectively formed within the openings 211.

Figure 2E:
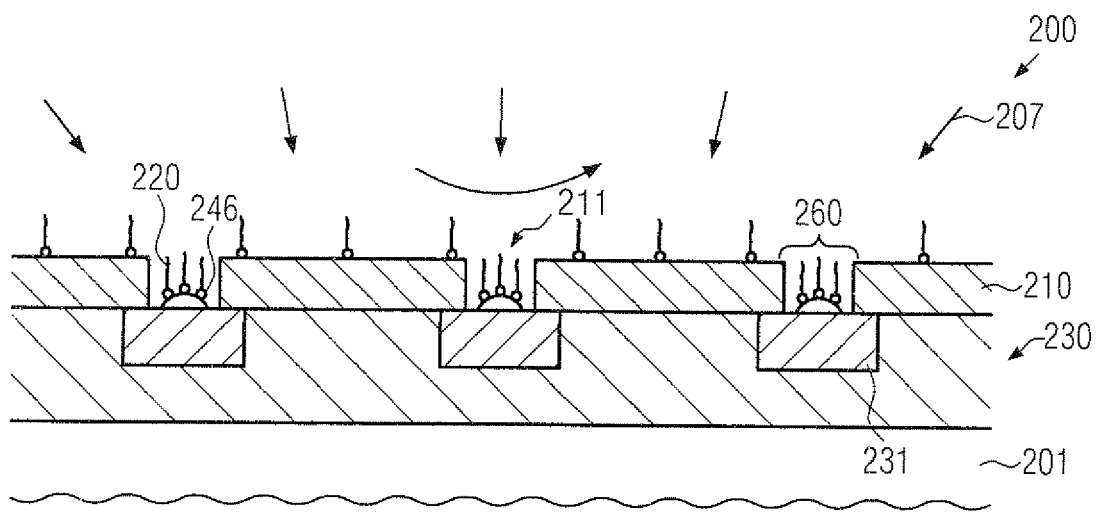
FIG. 2e schematically illustrates a cross-sectional view of the device when forming functional molecules selectively in the via openings, according to illustrative embodiments.

FIG. 2e schematically illustrates the device 200 during a further advanced process sequence 207, in which a film containing functional molecules 220 may be applied, for instance, by immersing the device 200 in a corresponding solution, by spin coating and the like, wherein the functional molecules 220 may strongly adhere to the adhesion clusters 246 within the openings 211, while any adhesion to the material 210 may be significantly less. The functional molecules 220 may have characteristics as previously described with reference to the functional molecules 120, for instance with respect to providing distinguishable states or the overall size of the molecules and the like. For example, a length of the molecules 220 and a depth of the openings 211 may be appropriately adapted to each other, as previously explained. The process sequence 207 may further comprise a removal process step in which unwanted functional molecules may be removed from the layer 210, which may be accomplished on the basis of a rinse process in de-ionized water by using mild wet chemical etch chemistries and the like. On the other hand, the functional molecules 220 within the openings 211 may strongly adhere to the clusters 246, which in turn may determine the amount of molecules within each opening 211. Consequently, the openings 211, in combination with the functional molecules 220, may form corresponding memory cells 260, the functional behavior of which may be determined by the amount and the characteristics of the functional molecules 220.

Figure 2F:
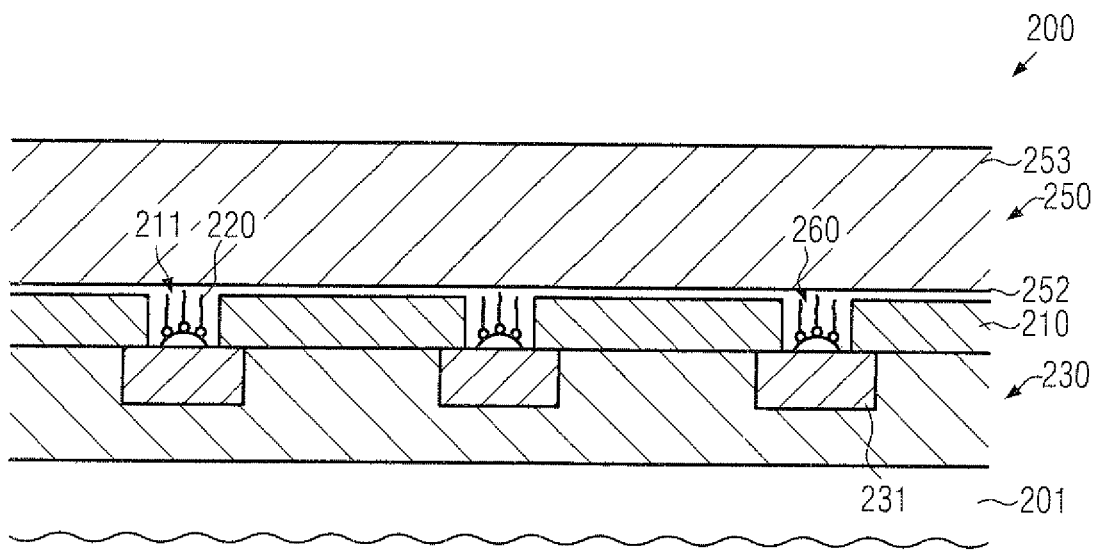
FIGS. 2f-2g schematically illustrate cross-sectional views of the device in further advanced manufacturing stages in providing a second electrode for the memory cells, according to illustrative embodiments.

FIG. 2f schematically illustrates the device 200 in a further advanced manufacturing stage in which a portion of a further device layer 250 may be formed above the layer 210 comprising the memory cells 260. In the embodiment shown, the device level 250 may comprise a dielectric material 252, for instance in the form of an etch stop material and the like, followed by a further dielectric material 253, for instance provided on the basis of silicon dioxide, silicon nitride, silicon carbide and the like, while in other cases low-k dielectric materials may also be used. It should be appreciated that, if required, an additional protective material may be provided within the openings 211, if required, such as a polymer material and the like, while in other cases the material 252 may be provided so as to also fill, at least partially, the openings 211. For example, the material 252 may be provided on the basis of any appropriate deposition technique, possibly in combination with an additional fill material for the openings 211 and thereafter a further planarization step, for instance on the basis of chemical mechanical polishing (CMP) and the like, may be performed so as to obtain a desired remaining thickness of the layer 252, wherein, if required, an end portion of the molecules 220 may be exposed. In other cases, the molecules 220 may terminate in the material layer 252 if a direct contact with a signal line to be formed in the material 253 may not be required. In other cases, an end portion of the functional molecules 220 may be exposed after patterning of the material 253 on the basis of the layer 252 that may be used as an efficient etch stop layer that may preserve integrity of the molecules 220 during the patterning of the dielectric material 253.

Figure 2G:
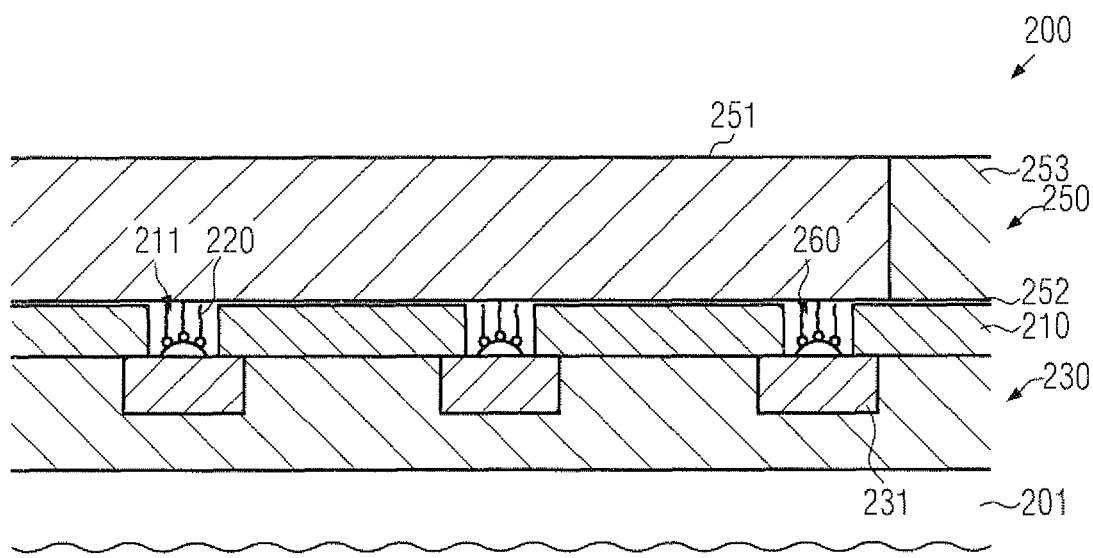

FIG. 2g schematically illustrates the device 200 in a further advanced manufacturing stage. As shown, a conductive line 251, such as a metal line, may be formed in the dielectric material 253 and may thus operatively connect to each of the memory cells 260. That is, the material of the conductive line 251 may be in direct contact with the functional molecules 220 or may at least allow electrical access to the molecules 220, for instance by electromagnetic interaction, tunnel currents and the like, as previously discussed. The device 200 as shown in FIG. 2g may be formed by providing an appropriate etch mask and a trench in the dielectric material 253 using well-established anisotropic etch techniques. As previously indicated, the material 252 may be used as an efficient etch stop material, which may also preserve integrity of the molecules 220, when an exposure thereof to the corresponding reactive etch ambient is considered inappropriate. Thereafter, if required, a further etch step may be performed on the basis of an appropriate etch chemistry in order to remove a portion of the material 252, thereby exposing an end portion of the molecules 220, which may have an appropriate size, as previously discussed. During the corresponding etch process, the material 252 may be removed substantially completely, or a portion thereof may be maintained above the layer 210, depending on the overall process requirements. Thereafter, a conductive material, such as metal and the like, may be deposited, for instance by electrochemical deposition techniques, CVD, physical vapor deposition (PVD) and the like. It should be appreciated that additional materials may be deposited, for instance in the form of conductive barrier materials, seed materials and the like, if required. Thereafter, any excess material may be removed, for instance by CMP and the like, thereby providing the line 251 connecting to the memory cells 260.

Figure 2H:
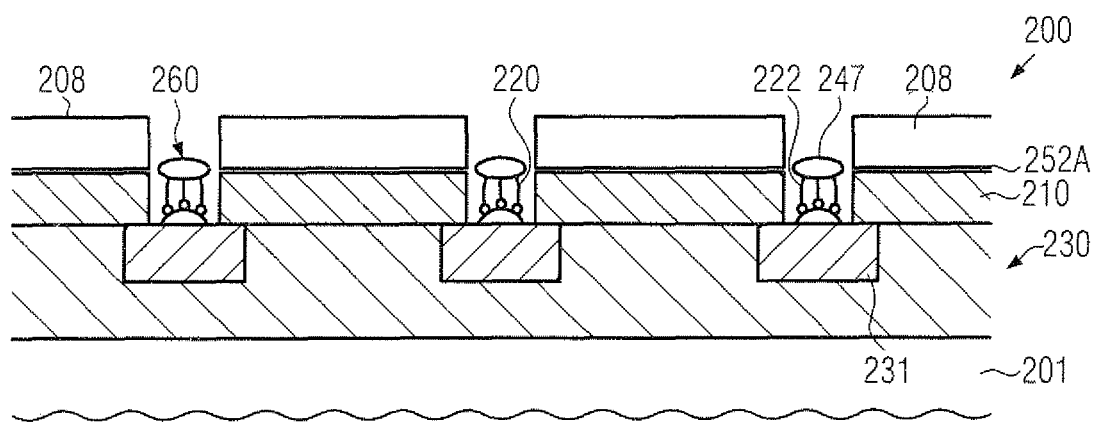
FIG. 2h schematically illustrates a cross-sectional view of the device in manufacturing stages for providing a superior upper contact region for the functional molecules, according to illustrative embodiments.

FIG. 2h schematically illustrates the device 200 according to further illustrative embodiments in which the memory cells 260 may be filled with a protective material 252A so as to expose end portions 222 of the functional molecules 220. The end portions 222 may represent respective functional groups that may provide superior adhesion to a specific material, such as gold, platinum, copper, silver and the like. Furthermore, a mask 208 may be provided so as to expose the memory cells 260 and thus the end portions 222. To this end, the material 252A may be applied, possibly in combination with a planarization process, if required, followed by the deposition of the mask material, which may then be patterned on the basis of available patterning techniques. During the patterning of the mask layer 208, the material 252A may act as an etch stop material, while in other cases material may be removed so as to expose the end portions 222. Thereafter, a further solution including appropriately selected micelles may be applied, as is also previously discussed, thereby positioning corresponding micelles within the openings of the mask layer 208, which may thus have incorporated therein appropriate clusters for connecting to the end portions 222. Thereafter, the polymer base material of the micelles may be selectively removed, thereby forming additional adhesion clusters 247 that strongly adhere to the functional molecules 220. Consequently, the clusters 247 may represent appropriate contact areas for the subsequent processing, for instance for forming the dielectric material 253 (FIG. 20 and patterning the same, as discussed above. Hence, providing the additional adhesion clusters 247 in combination with the fill material 252A may provide superior integrity of the functional molecules 220, while nevertheless enabling a reliable direct contact to the conductive line 251 (FIG. 2g).

Figure 2I:
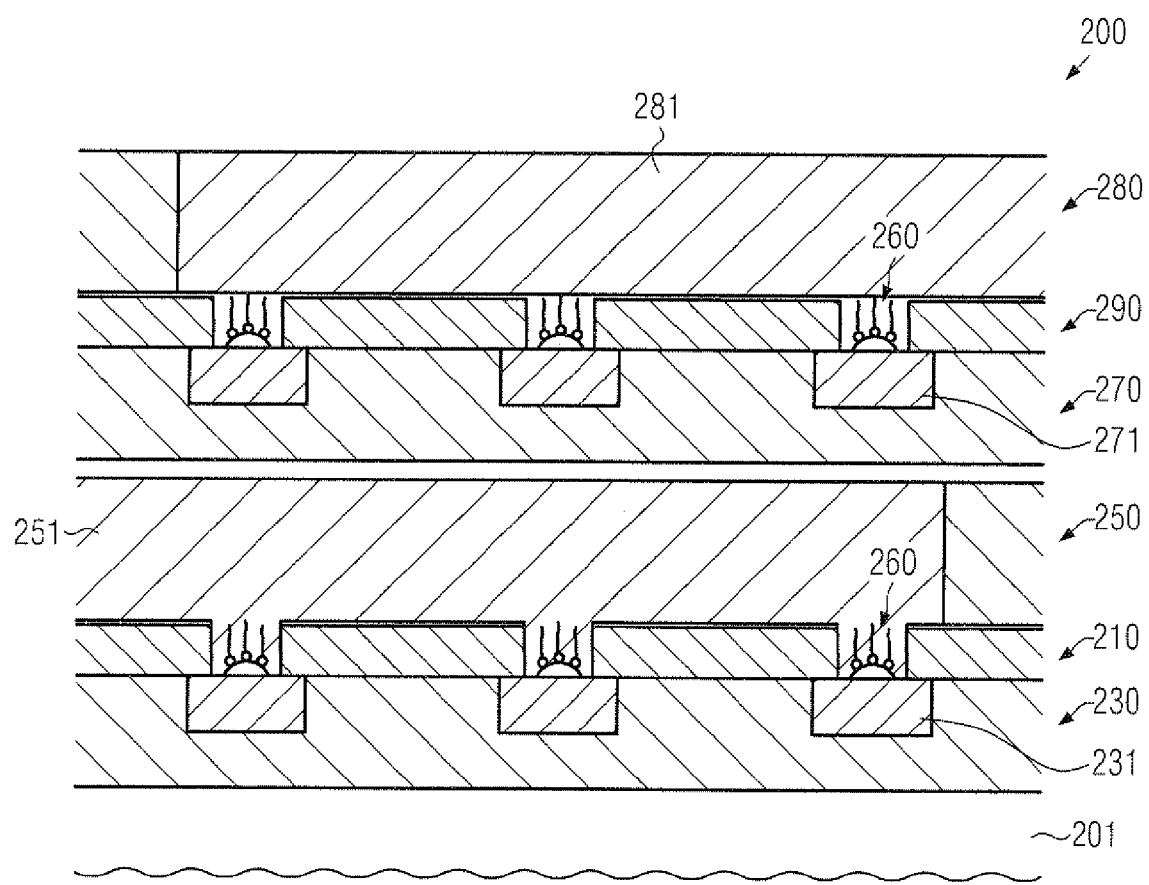
FIG. 2i schematically illustrates a cross-sectional view of the device according to further illustrative embodiments in which a plurality of via levels, and thus of levels of memory arrays, may be provided.

FIG. 2i schematically illustrates the device 200 according to further illustrative embodiments in which two or more arrays of memory cells 260 are stacked on top of each other, thereby providing a very space-efficient three-dimensional memory area. As illustrated, a further device level 270 may be formed above the device level 250 and comprise conductive regions 271, for instance in the form of metal lines, followed by a further dielectric material 290 comprising the memory cells 260, which are contacted by conductive lines 281 of a further device level 280. With respect to manufacturing techniques for forming the memory cells 260 on the basis of the functional molecules 220 in different device levels, the same criteria may apply as previously explained with reference to the layers 230, 210 and 250.

Figure 2J:
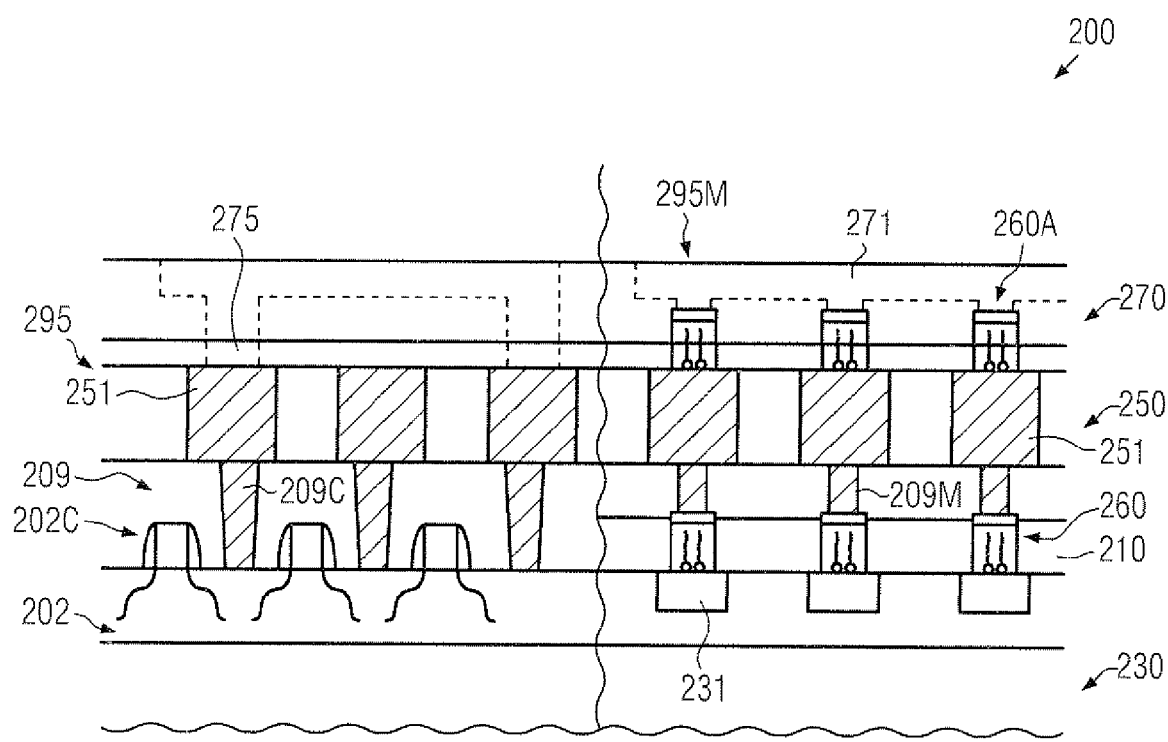
FIG. 2j schematically illustrates a cross-sectional view of an integrated circuit device comprising semiconductor-based circuit elements in combination with memory cells formed by functional molecules, according to further illustrative embodiments.

FIG. 2j schematically illustrates the device 200 according to illustrative embodiments in which a plurality of semiconductor-based circuit elements 202C may be formed in and above a semiconductor layer 202. For example, the circuit elements 202C may represent field effect transistors formed in accordance with CMOS technologies or any other appropriate approaches, wherein critical dimensions may be 40 nm and less. Furthermore, a metallization system 295 may be formed above the circuit elements 202C, wherein a portion of the metallization system 295 may represent a memory area 295M comprising a plurality of memory cells 260, which may be distributed across various device levels, as previously explained. For example, in the embodiment shown, the device layer 230 may represent a portion of the semiconductor layer 202 and may comprise the conductive regions 231, for instance in the form of doped semiconductor areas. Furthermore, the dielectric material 210 may represent a portion of a dielectric material of a contact level 209, which may connect a circuit element 202C with the metallization system 295 by means of corresponding contact elements 209C. In the memory area 295M, appropriately adapted contact elements 209M may be provided, if required, in order to interface the memory cells 260 with the metal lines 251 of the device layer 250, which may represent the first metallization layer of the metallization system 295. Furthermore, the device layer 270 may represent a further metallization layer wherein corresponding vias 275 may connect to the metal lines 251 above the circuit elements 202C while corresponding memory cells 260A, which may have the same or a different configuration compared to the memory cells 260, may connect to the metal lines 271 in the memory area 295M.

As previously discussed, due to the high degree of flexibility in adjusting the characteristics of functional molecules and corresponding micelles including adhesion clusters, the memory area 295M may be efficiently incorporated into the metallization system 295 on the basis of process techniques used for forming the semiconductor-based elements 202C and the metallization system 295 without additional sophisticated techniques.

As a result, the present disclosure provides manufacturing techniques and integrated circuit devices in which memory cells may be efficiently formed on the basis of functional molecules, while using process techniques that may be employed for forming semiconductor-based circuit elements. Consequently, efficient hybrid device architectures may be formed, for instance by incorporating a three-dimensional memory area in a metallization system of a semiconductor device, thereby providing superior performance due to the significantly increased information density compared to semiconductor-based memory cells. For this purpose, the functional molecules may be placed in openings or vias that may be formed on the basis of the available patterning techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a dielectric material layer above a first conductive region of an integrated circuit device;
    forming an opening in said dielectric material layer, said opening having specified lateral dimensions and a specified depth and extending towards said first conductive region;
    forming an adhesion material at a bottom of said opening;
    after forming said adhesion material, positioning one or more functional molecules in said opening, each of said one or more functional molecules having at least two different states for representing at least one bit of information, a size of said one or more functional molecules being adapted to at least one of said specified lateral dimensions and said specified depth, said functional molecules being operatively connected to said first conductive region so as to enable electric access to said one or more functional molecules in said opening; and
    forming a second conductive region so as to operatively connect to said one or more functional molecules.

2. The method of claim 1, wherein forming an adhesion material at a bottom of said opening comprises applying a solution comprising micelles including a cluster of an adhesion species, wherein a lateral size of said micelles is selected so as to be less than at least said specified lateral dimensions of said opening.

3. The method of claim 2, wherein said micelles are formed by di-block copolymers having bonded thereto a metal species.

4. The method of claim 3, further comprising establishing a reactive process ambient so as to remove said copolymers selectively to said metal species.

5. The method of claim 4, further comprising forming an etch mask above said dielectric material layer, forming said opening on the basis of said etch mask and applying said solution in the presence of said etch mask.

6. The method of claim 5, further comprising removing said etch mask after removing said copolymers selectively to said metal species.

7. The method of claim 1, wherein said opening is formed so as to connect to said first conductive region and wherein an exposed portion of said first conductive region is used as an adhesion area for said one or more functional molecules.

8. The method of claim 1, further comprising forming a second dielectric material layer above said dielectric material layer and above said opening, forming a trench in said second dielectric material layer and filling said trench with a conductive material.

9. The method of claim 1, further comprising forming another dielectric material layer above said opening and said second conductive region, forming another opening in said another dielectric material layer and filling in said another opening another one or more functional molecules, wherein said opening and said another opening form a stacked configuration.

10. The method of claim 1, further comprising forming circuit elements in a semiconductor material of said integrated circuit device.

11. The method of claim 10, wherein forming said circuit elements comprises forming transistors having a critical dimension of approximately 40 nm or less.

12. The method of claim 1, wherein forming said second conductive region so as to operatively connect to said one or more functional molecules comprises forming a metal line that is in direct contact with said one or more functional molecules.

13. The method of claim 1, wherein forming said second conductive region so as to operatively connect to said one or more functional molecules comprises forming a metal line that is in electromagnetic interaction with said one or more functional molecules.

14. A method of forming a semiconductor device comprising a memory area, the method comprising:
   forming a via in an interlayer dielectric material formed above a first device layer, said first device layer comprising a first electrode region;
   filling in said via with one or more functional molecules, said functional molecules having at least two different functional states for representing at least one bit of information, said one or more functional molecules being operatively connected to said first electrode region;
   at least partially filling said via with a protective insulating material so as to protect said one or more functional molecules;
   forming a second device layer above said first device layer; and
   after forming said second device layer, forming a second electrode region in said second device layer, said second electrode region being operatively connected to said one or more functional molecules.

15. The method of claim 14, further comprising forming an adhesion material on a bottom of said via and thereafter filling in said via with said one or more functional molecules so as to connect to said adhesion material.

16. The method of claim 14, further comprising forming a second interlayer dielectric material above said second device layer, forming a second via in said second interlayer dielectric material and filling in said second via with one or more second functional molecules.

17. The method of claim 14, wherein forming said second electrode region being operatively connected to said one or more functional molecules comprises forming a metal line that is in direct contact with said one or more functional molecules.

18. A method, comprising:
   forming a dielectric material layer above a first conductive region of an integrated circuit device;
   forming an opening in said dielectric material layer, said opening having specified lateral dimensions and a specified depth and extending towards said first conductive region;
   positioning one or more functional molecules in said opening, each of said one or more functional molecules having at least two different states for representing at least one bit of information, a size of said one or more functional molecules being adapted to at least one of said specified lateral dimensions and said specified depth, said functional molecules being operatively connected to said first conductive region so as to enable electric access to said one or more functional molecules in said opening;
   forming a second dielectric material layer above said dielectric material layer and above said opening, forming a trench in said second dielectric material layer and filling said trench with a conductive material; and
   forming a second conductive region so as to operatively connect to said one or more functional molecules.

19. The method of claim 18, further comprising forming a protective insulating material in said opening prior to forming said second dielectric material layer.

20. The method of claim 19, further comprising exposing a contact portion of said one or more functional molecules prior to forming said second dielectric material layer.

21. A method of forming a semiconductor device comprising a memory area, the method comprising:
   forming a via in an interlayer dielectric material formed above a first device layer, said first device layer comprising a first electrode region;
   forming an adhesion material on a bottom of said via;
   filling in said via with one or more functional molecules so as to connect to said adhesion material, said functional molecules having at least two different functional states for representing at least one bit of information, said one or more functional molecules being operatively connected to said first electrode region;
   forming a second device layer above said first device layer; and
   after forming said second device layer, forming a second electrode region in said second device layer, said second electrode region being operatively connected to said one or more functional molecules.

22. The method of claim 21, wherein forming said adhesion material comprises applying a solution including micelles with a size that is adapted to a size of said via and removing a portion of said micelles.

23. The method of claim 21, further comprising forming a mask layer above said interlayer dielectric material prior to applying said solution, wherein said mask layer exposes said via.

* * * * *